United States Patent [19]

Blitchington

[11] 4,333,044
[45] Jun. 1, 1982

[54] METHODS OF AND SYSTEM FOR ALIGNING A DEVICE WITH A REFERENCE TARGET

[75] Inventor: Frank H. Blitchington, Richmond, Va.

[73] Assignee: Western Electric Co., Inc., New York, N.Y.

[21] Appl. No.: 182,730

[22] Filed: Aug. 29, 1980

[51] Int. Cl.³ .............................................. G05B 21/02
[52] U.S. Cl. ..................... 318/636; 318/640; 356/400; 250/548; 250/561; 250/211 J
[58] Field of Search ................. 318/636, 640; 356/399, 356/400; 250/548, 561, 211 R, 211 J

[56] References Cited

U.S. PATENT DOCUMENTS

| | | | |
|---|---|---|---|
| 3,739,247 | 6/1973 | Yamaguchi et al. | 318/640 |
| 3,843,916 | 10/1974 | Trotel | 318/640 |
| 4,012,148 | 3/1977 | Marantette et al. | 356/400 |
| 4,070,117 | 1/1978 | Johannsmeier et al. | 356/400 |
| 4,153,367 | 5/1979 | Lietar et al. | 356/400 |
| 4,153,371 | 5/1979 | Kolzumi et al. | 356/400 |

*Primary Examiner*—J. V. Truhe
*Assistant Examiner*—Eugene S. Indyk
*Attorney, Agent, or Firm*—J. B. Hoofnagle

[57] ABSTRACT

In the process of aligning an image sensor (33) with a datum mark (23) on an artmaster (21), each of a plurality of elements of the sensor accumulate a charge based on the level of light sensed. The elements of the sensor (33) are repetitively scanned to obtain data pulses relating to the charges on the elements as an indication of the level of sensed light. Data pulses from selected elements of the sensor (33) are counted and compared to develop a signal representative of, and to facilitate visual indication of, the alignment or misalignment of the sensor (33) and the datum mark (23). If the sensor (33) and the datum mark (23) are misaligned, the developed signal facilitate control of servo motors (28 and 29) to move the sensor (33) into alignment with the datum mark (23). Data pulses derived from all elements of the sensor (33) are used to facilitate an electronic reproduction on a display board (40) of the position of the datum mark (23) relative to the sensor.

19 Claims, 16 Drawing Figures

METHODS OF AND SYSTEM FOR ALIGNING A DEVICE WITH A REFERENCE TARGET

TECHNICAL FIELD

This invention relates to methods of and a system for aligning a device with a reference target and particularly relates to methods of and a system for aligning a movable support with a datum mark on a printed circuit artmaster.

BACKGROUND OF THE INVENTION

In the manufacture of printed circuits, a circuit pattern is initially generated as a negative or positive image on a clear film. The image film serves as an artmaster from which numerous pieces of artwork, which embody the pattern, can be made. The artwork is then used in the actual manufacture of printed circuits.

During the manufacture of the artmaster, the circuit pattern must be located precisely and accurately dimensional on the film. This insures that the pattern of printed circuits, made by use of artwork generated from the artmaster, are precisely located on a supporting substrate.

To insure the accurate dimensioning and precise locating of the circuit pattern on the artmaster, datum marks are developed on the artmaster simultaneously with the circuit pattern and provide reference points relative to the circuit pattern. It is critically important that the datum marks be located at precise points on the artmaster and that the marks be spaced precise distances from each other. The datum marks then serve as locating reference points for the artwork in the ultimate manufacture of the printed circuits. The datum marks are also developed from the artwork onto the printed circuit substrate and provide the capability for ultimate positioning of the substrate to locate the circuit for additional processing (e.g., drilling holes, selective plating, etc.).

In one system of manufacturing the artmaster, the distance between and the location of the datum marks developed on the artmaster must be measured relative to the circuit pattern prior to the development of the artwork by use of the artmaster. In such a system, the artmaster is developed on the film and, while the film is in place, the distance between the datum marks is measured by use of a laser inferometer. The insure accuracy in the distance measurement, the inferometer must be precisely located over each of the datum marks during the measuring process.

In the manufacture of artwork, an unexposed film can be positioned on a movable table below a shutter/lens assembly. The artmaster is located between a light source and the assembly for selective exposure of the artmaster pattern onto the unexposed film. To insure accuracy of location of the pattern of the artwork, the artmaster must be precisely located relative to the table and the unexposed film prior to selective exposure. Still further, a single pattern developed on an artmaster can be developed at several locations on a single artwork. This provides artwork with a plurality of repetitive patterns which can be used to make the same plurality of printed circuits in one in-line procedure on a single substrate. Each of the plurality of circuit patterns will contain the datum marks developed from the artmaster. Again, the criticality of locating and aligning the datum marks is apparent.

One technique for centering an artwork reference target at a given location is disclosed in U.S. Pat. No. 4,012,148 which issued to W. F. Marantette and R. B. Marantette. As disclosed in the patent, an image of the artwork target is projected onto a rear projection screen. Four photocells are positioned adjustably along X-Y coordinates on the front face of the screen. Elongated photocells are initially located quadrilaterally about the intersection point on the orthogonal axes to sense ideally and equally light-projecting portions of the target when the target is in the given location. In use, as the target image is projected onto the screen, the photocells sense the position of the image, make comparisons of light sensed by the cells and facilitate control of servo motors to move the artwork until equal amounts of light are sensed by the photocells. At this time, the artwork is positioned in the given location.

U.S. Pat. No. 4,012,148 teaches the use of discrete photocells in the aligning system. Since each cell is separate and spaced from the other cells, each cell could be operating in a temperature environment different from that of the other cells. Also, since the cells are separate, they may not be matched for linearity which could result in variations in the comparative electrical outputs of the cells for equally sensed light intensity. Or, unequally sensed light could improperly provide indication of alignment of the target with the photocells. Further, the relatively large size required for individual cells indicates that the sensing characteristics of each cell may vary over the entire active area of the cell. With such variations in the sensing characteristics, it is difficult to obtain a uniform response when examining a target having fine-line definition.

Consequently, there is a need for a system with matched linearity and uniform response to accurately align a target of fine-line definition without concern for temperature variations.

SUMMARY OF THE INVENTION

In a method of aligning a device with a reference target, in accordance with certain principles of the invention, at least two spaced light-sensing charge-accumulating elements of the device are located in general alignment with the target. In this position, those elements which are sensing light will develop an accumulating charge. Each element is scanned a plurality of times to determine the accumulated charge on the element during each scan. When the accumulated charge exceeds a predetermined level during each scan, a data signal is developed. The number of data signals emanating from each element are then counted and the counts are compared. A signal is then developed in response to the comparison and is representative of the comparative light sensed by the two elements.

A system for aligning a device with a reference target, in accordance with certain principles of the invention, includes at least two spaced light-sensing charge-accumulating elements located within the device. Means are provided for locating the device in general alignment with the target so that an accumulating charge will develop within those elements which are sensing light. Other means scan each element a plurality of times to determine the accumulated charge on the element during each scan. Means also are provided for developing a data signal during each scan for each element when the accumulated charge exceeds a predetermined level. Counting means counts the number of data signals emanating from each element while other means compares the counts of data signals from the two elements. Means acts in response to the comparison means output and develops a signal which represents the comparative light sensed by the two elements.

DETAILED DESCRIPTION

Figure 1:
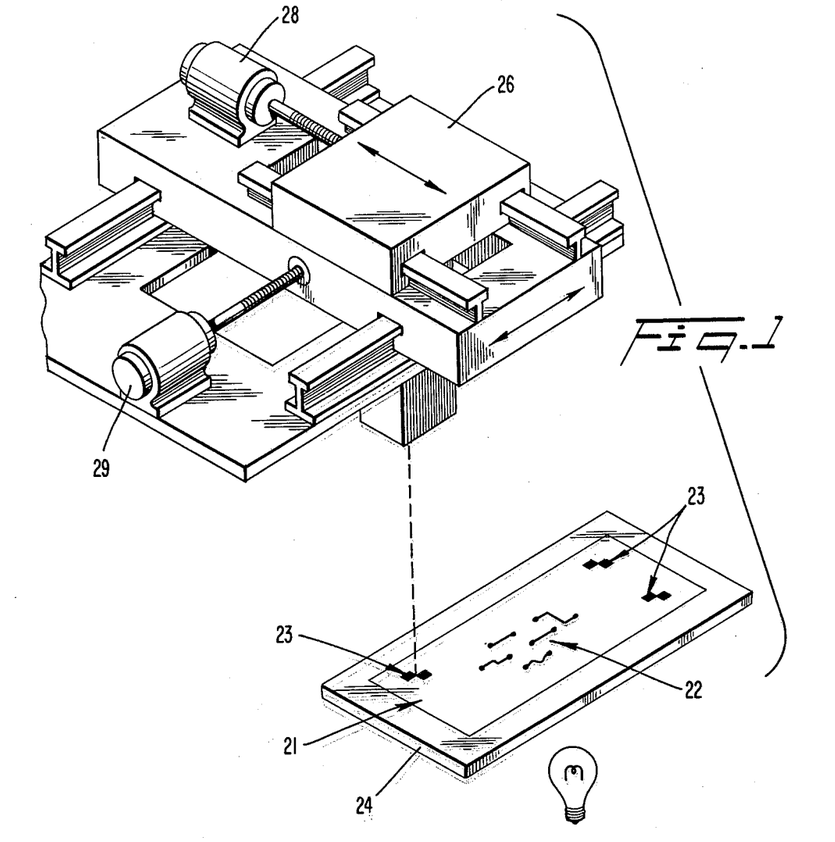
FIG. 1 is a perspective view showing a printed circuit artmaster located beneath a movable housing which supports an image sensing device.

Referring to FIG. 1, an artmaster, designated generally by the numeral 21, is generated or manufactured by selectively exposing and developing photographic film to reveal a printed circuit pattern 22 and reference targets such as datum marks 23. The circuit pattern 22 and the datum marks 23 appear as darkened areas on an otherwise clear plastic film. As illustrated more clearly in FIG. 2, each of the datum marks 23 is formed by two darkened squares which are arranged diagonally.

The artmaster 21 is used to manufacture artwork (not shown) which contain the darkened circuit pattern on an otherwise clear plastic film. The artmaster is stored in a protective environment while the artwork is used in the manufacture of metallic printed circuits on supporting substrates (not shown).

In many instances, the circuits are formed on the substrates relative to holes prepunched in the substrates. The holes eventually serve as plated through holes or alignment holes during the processing of the substrate through the circuit manufacture. Thus, it is critically important that the circuit pattern of the artwork be located precisely relative to holes in the substrate during the period when the circuit pattern of the artwork is being cast upon a metallic surface of the substrate.

In order to provide the required accuracy in locating the artwork pattern relative to the substrate, the datum marks 23 are formed on the artmaster 21. The datum marks 23 are located precisely with respect to the circuit pattern 22 and are spaced apart by precise distances. If the datum marks 23 are not properly spaced on the artmaster 21, the circuit pattern 22 may not be properly cast upon the metallic surface of the substrate which could result in the manufacture of many defective printed circuit units.

To insure that the artwork contains an accurate depiction of the dimensional layout of the circuit pattern 22, the distances between the datum marks 23 on the artmaster 21 should be measured precisely prior to using the artmaster to manufacture the artwork.

As illustrated in FIG. 1, the artmaster 21 is positioned on a table 24 which is located beneath a movable housing 26. A laser inferometer (not shown) is contained within the housing 26 and is used to accurately measure the distances between the datum marks 23 of the artmaster 21. However, to insure such accurate measurements, the inferometer must be precisely located relative to the datum marks 23 during the measuring process.

Figure 3:
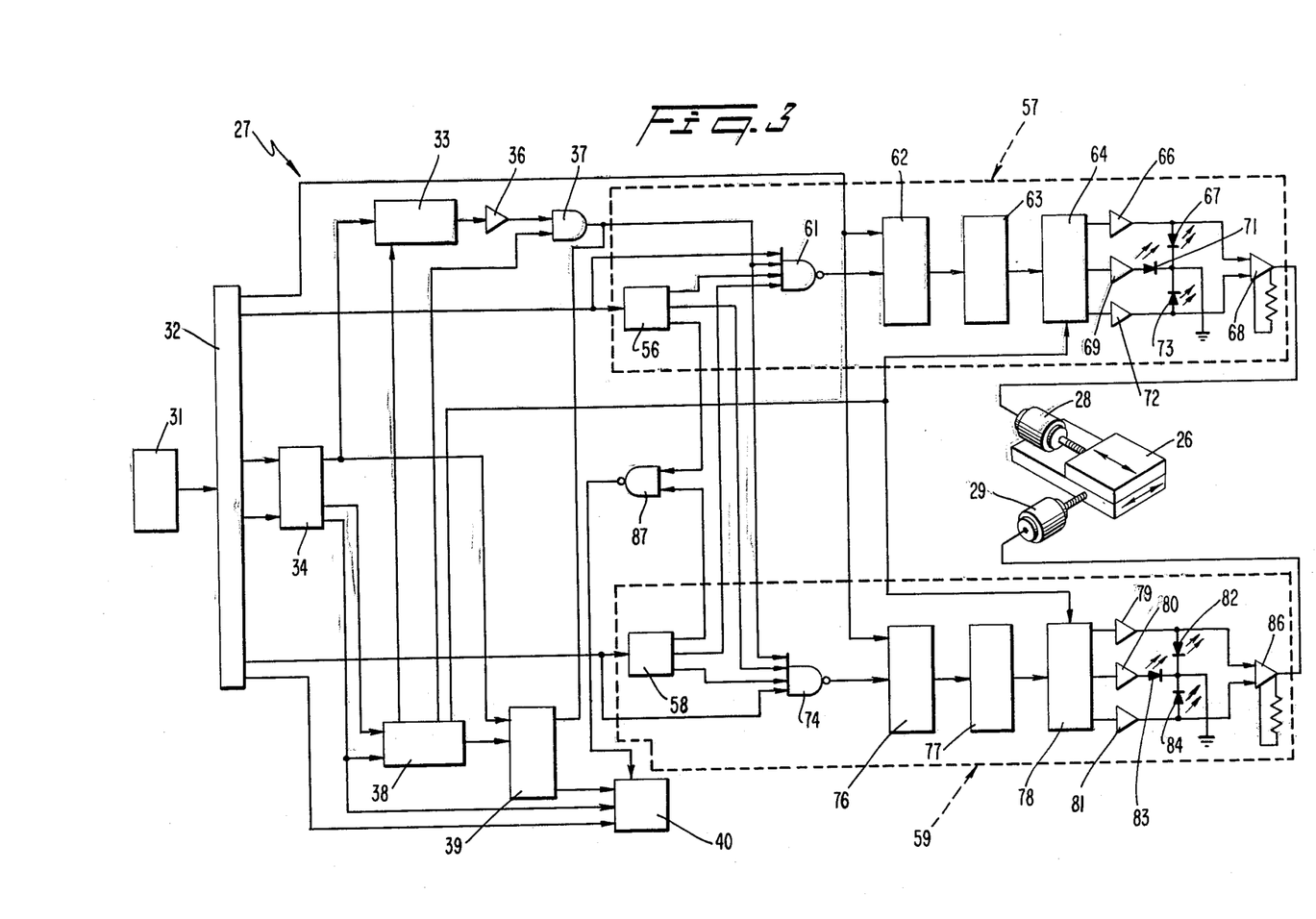
FIG. 3 is an electrical block diagram showing a system, embodying certain principles of the invention, for aligning the image sensing device of FIG. 1 with the target of FIG. 2.

A system, designated generally by the numeral 27, for aligning the inferometer with the datum marks 23, is illustrated in the block diagram of FIG. 3 and the schematic diagram of FIGS. 6, 7, 9, 10, 12 and 13. The system 27 is contained within the housing 26 (FIG. 1) and controls the operation of an "X" servo motor 28 (FIG. 1) and a "Y" servo motor 29 (FIG. 1) to facilitate the accurate positioning, in a conventional manner, of the housing and the inferometer relative to the datum marks 23.

Referring to FIG. 3, the system 27 includes an oscillator 31 which generates a signal at a basic frequency which is coupled to a multiple frequency divider 32. The frequency divider 32 divides the basic frequency by multiples of two to provide signals at twelve different frequencies. Ten of the signals are coupled to a device such as an image sensor 33 through a buffer 34. The image sensor 33 includes an MOS device having 1024 separate light-sensing charge-accumulating elements fabricated on a single chip and arranged in a 32-by-32 array. The sensor 33 also includes a plurality of control circuits (not shown) which facilitate an examination of each element on a sequential basis under the control of the incoming signals of different frequencies to determine the amount of light sensed by the elements. The sensor 33 is controlled to process through sixteen scanning cycles for a given target such as the datum mark 23. The light being sensed at a given point within the associated elements during the sixteen scanning cycles is cummulative so that, during the occurrence of the sixteenth cycle, a fully enhanced representation of the target has been sensed by the sensor 33.

Signals at the output of the sensor 33 are serial and analog with the amplitude being determined by the cummulative amount of light sensed by each element during the sixteen scanning cycles. The serial output is passed through amplifier 36 and is coupled to a first input of gate 37. This first input is voltage sensitive and serves as a threshold device to convert the analog voltage to digital data pulses. A second input of gate 37 is normally high except during a period when the sensor 33 is being reset after the sixteenth cycle. Therefore, data pulses in digital form appear at the output of the gate 37 during the period of the sixteen scanning cycles. Gate 37 is designed to operate after enabling inputs reach a predetermined level. Gate 37 thereby provides facility for developing a data pulse for each scan of each element only after the accumulated charge on the element has reached a threshold level. Thus, when one of the elements is sensing a relatively small amount of light, the accumulating charge is too low to exceed the threshold of gate 37 even though an output pulse from sensor 33 is amplified and fed to the gate. System 27 thereby insures that light is being sensed by the elements prior to the development of data pulses.

Two of the signals from the frequency divider 32 are coupled through buffer 34 to a reset and control circuit 38. A first output of circuit 38 is fed to the second input of gate 37 at the beginning of the period of the first scanning cycle to permit passage through the gate of data signals from the sensor 33. The data pulses are fed from the gate 37 to a data input of a RAM 39. The ten signals which are fed from the frequency divider 32 to the sensor 33 are also fed to inputs of the RAM 39 so that the data pulses entering the RAM can be related to particular elements in the sensor and stored accordingly in the RAM. A pulse is fed from the circuit 38 to an input of the RAM 39 and instructs the RAM to receive and store data pulses only during the sixteenth scanning cycle.

At all other times, the stored data is fed from the RAM 39 to a LED matrix display board 40 which is vertically and horizontally clock-controlled by signals from the frequency divider 32 and the buffer 34, respectively. The display board 40 includes a plurality of LED's 42 (FIG. 13) which are arranged in a 32-by-32 matric identical to the 32-by-32 matrix of the elements of the sensor 33. The LED's 42 are activated in a pattern corresponding to the pattern of light sensed by the elements of the sensor 33 as it appears at each sixteenth scan. Thus, the display board 40 provides an electronic reproduction of the location of the datum mark 23 relative to the image sensor 33.

Figure 4:
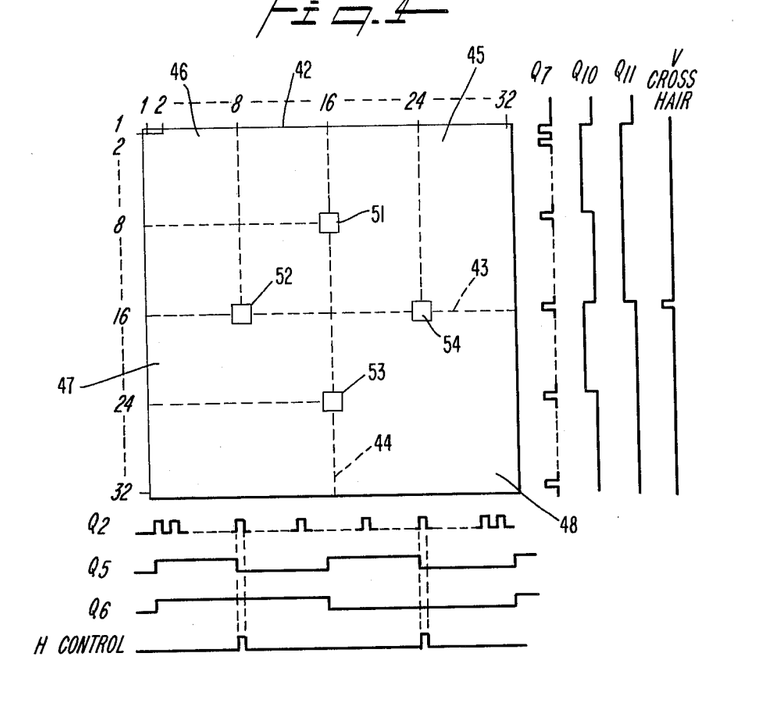
FIG. 4 is a view showing a representation of our elements of the image sensing device with related wave forms.

Referring to FIG. 4, a representation of the 32-by-32 matrix array of the elements of sensor 33 is illustrated within a square enclosure 42. Thirty-two columns of elements extend vertically in the illustration of FIG. 4 and are represented by the numerals extending across the top of the enclosure. Thirty-two rows of elements extend horizontally in the illustration of FIG. 4 and are represented by the numerals extending along the left side of the enclosure. Horizontal and vertical cross hairs 43 and 44, respectively, are illustrated for the purpose of discussion. Further, the cross hairs 43 and 44 define quadrants 45, 46, 47 and 48.

Figure 2:
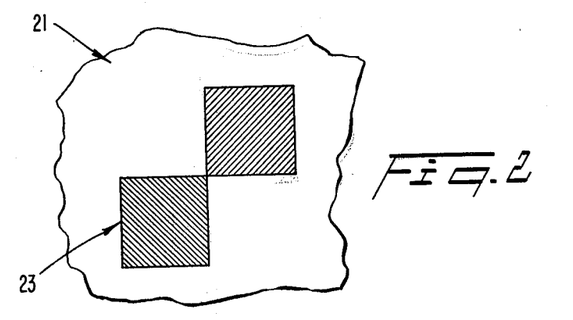
FIG. 2 is a partial plan view showing a reference target on the printed circuit artmaster.

As illustrated in FIGS. 1 and 2, the datum mark 23 represents a four-quadrant unit with the first and third quadrants being darkened and the second and fourth quadrants being lightened to provide a fine line distinction between the quadrants. When the sensor 33 is aligned with the datum mark 23 (FIG. 2), the darkened first and third quadrants of the mark will be aligned with quadrants 45 and 47 of the sensor illustration of FIG. 4. Therefore, the sensor elements within quadrants 45 and 47 would sense no light while those within 46 and 48 would sense considerable light.

Figure 5:
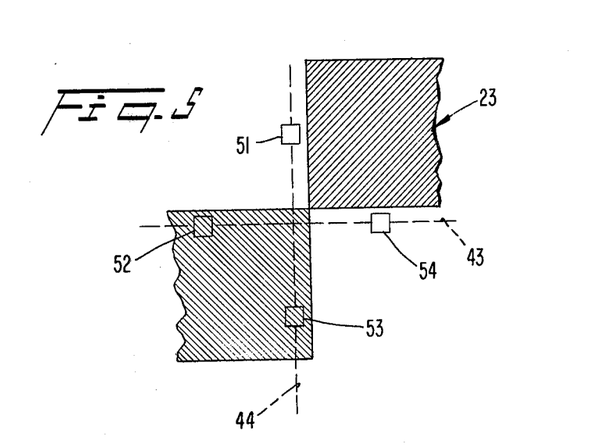
FIG. 5 is a view showing an overlay of the reference target and the four elements of FIG. 4.

If the datum mark 23 is not aligned with sensor 33, for example, as depicted in FIG. 5, the sensor elements will photoelectrically sense the actual relative position of those portions of the datum mark within the enclosure 42.

Each sensor element could then be examined to provide indication of the amount of offset between the datum mark 23 and the sensor 33 and appropriate steps taken to move the mark and the sensor into alignment. However, this would require a considerable number of circuits to process data from the entire 1024 elements of the sensor 33 and to provide control signals for the aligning adjustment. Since the datum mark 23 will be aligned with the sensor 33 when the mark edges coincide with the cross hairs 43 and 44, only two sensing elements along each cross hair need be examined. For example, as illustrated in FIG. 4, vertical element 51 (col. 16, row 8), horizontal element 52 (col. 8, row 16), vertical element 53 (col. 16, row 24) and horizontal element 54 (col. 24, row 16) are selected to represent the alignment or non-alignment of the datum mark 23 with the sensor 33.

Referring again to FIG. 3, three signals of different frequencies are fed from the frequency divider 32 to a flip-flop 56 within a horizontal control channel 57. Three other signals of different frequencies are fed from the frequency divider 32 to a flip-flop 58 within a vertical control channel 59. Output pulses of flip-flops 56 and 58 are coupled to inputs of a NAND gate 61 located within the horizontal channel 57. In addition, the NAND gate 61 also receives data pulses from gate 37 and a signal from frequency divider 32. The combination of pulses from the flip-flops 56 and 58 and the signal from the frequency divider 32 combine to open the gate 61 only during the periods when data pulses are being received during each scanning cycle while relates to the light-sensed condition of horizontal elements 52 and 54 (FIG. 4). The output of gate 61 is fed to a counter 62 which counts the number of times light is sensed by the elements 52 and 54 and feeds this count data to a digital comparator 63. The comparator 63 compares the counts from elements 52 and 54 as a measure of horizontal alignment of the datum mark 23 with the sensor 33.

Referring to FIG. 5, the datum mark 23 is illustrated as being in misalignment with the cross hairs 43 and 44 which represents misalignment with the sensor 33. In this misalignment, horizontal element 52 is completely covered and is not sensing any light while horizontal element 54 is uncovered and senses considerable light. As data pulses resulting from elements 52 and 54 are fed to gate 61 during each scanning cycle, the counter 62 feeds the accumulating data to comparator 63. The comparator 63 compares the counts which are representative of the light sensed by elements 52 and 54 and feeds the comparative data to a latch circuit 64. However, the latch circuit 64 is unresponsive until after the sixteenth scan has been completed. At that time, a pulse is fed from the circuit 38 to the latch circuit 64 which permits the latch circuit to receive the final comparative data resulting from the just-completed sixteen scans.

If the light sensed by element 52 is less than that sensed by element 54, as illustrated in FIG. 5, a pulse is fed from the latch circuit 64 through an amplifier 66 to a LED 67 to indicate this condition. In addition, the pulse is coupled to an operational amplifier 68, the output of which controls the "X" servo motor 28. The servo motor 28 then moves the housing 26 to bring the sensor 33 into horizontal alignment with the datum mark 23. If the elements 52 and 54 are sensing equal amounts of light, a pulse is fed from the latch circuit 64 through an amplifier 69 to a LED 71 to indicate the balanced condition. No signal is fed to motor 28 under this condition. If more light has been sensed by element 52 than by element 54, a pulse is fed from the latch circuit 64 through an amplifier 72 to a LED 73 to indicate this condition. Also, a signal is fed to motor 28 through amplifier 68 to operate the motor accordingly and move the sensor 33 into alignment with the datum mark 23.

The latch circuit 64 will maintain a continuous mode condition at the outputs thereof until the next pulse has been received from circuit 38. This insures that any pulse at the output of the latch circuit 64, which was developed in response to a first sixteen-scan period, will continue to appear at that output during the next sixteen-scan period.

The vertical channel 59 functions in a manner identical to the horizontal channel 57 to provide control for the "Y" servo motor 29 when required. The vertical channel 59 includes a NAND gate 74, counter 76, comparator 77, latch circuit 78, amplifiers 79, 80 and 81, LED's 82, 83 and 84 and operational amplifier 86.

Outputs from flip-flops 56 and 58 are fed through a NAND gate 87 to the display board 40 to provide continuous activation of the LED's 42 (FIG. 13) which form "X" and "Y" cross hairs on the display comparable to cross hairs 43 and 44 (FIG. 4), respectively.

The specific schematic diagram for the system 27 is illustrated in FIGS. 6, 7, 9, 10, 12 and 13. Reference to code designations for various circuit elements beginning with the letters "MC" are taken from a data book entitled "McMOS Integrated Circuits Data Book" published by Motorola Semiconductor Products, Inc., first edition, December, 1973. Unless noted otherwise, other code designations are taken from a data book entitled "The TTL Data Book for Design Engineers" published by Texas Instruments Incorporated, second edition, 1976.

Figures 6, 8:
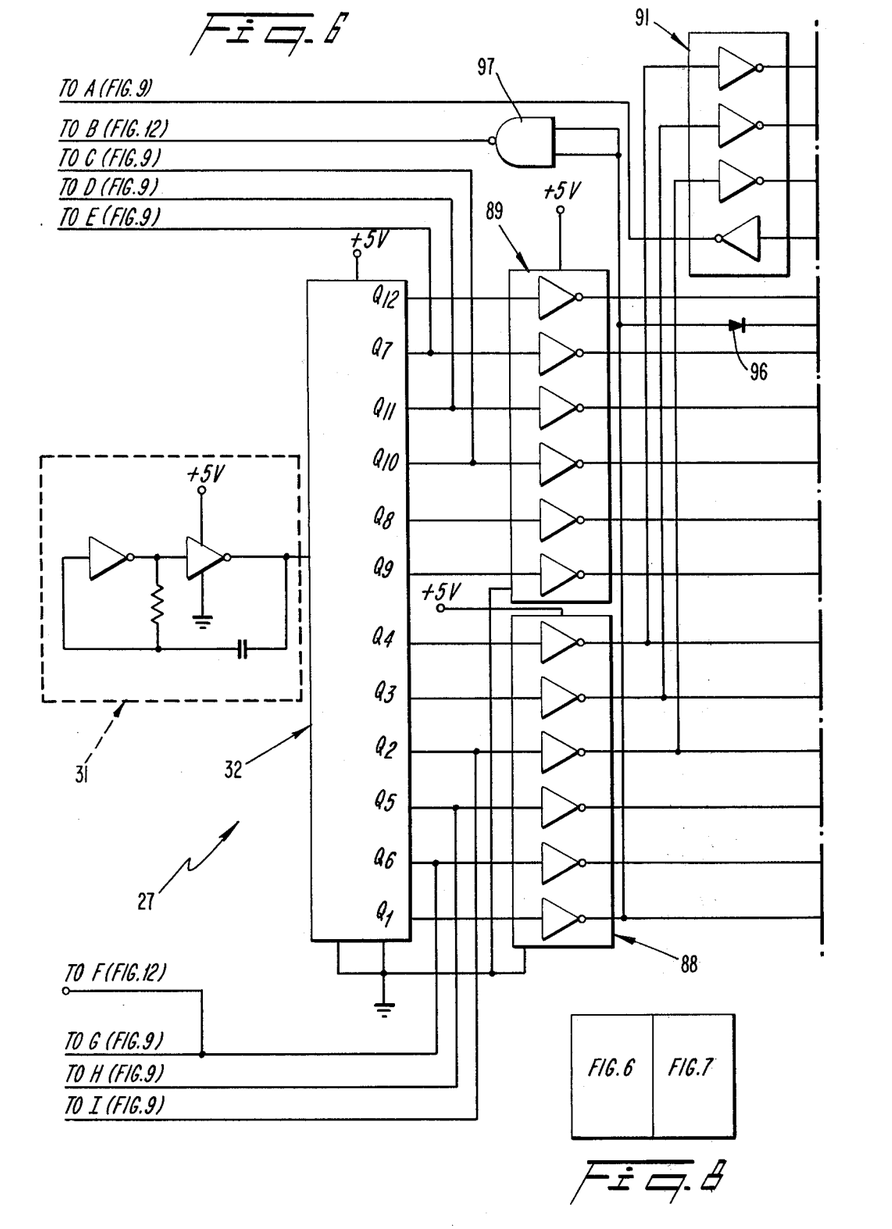
FIGS. 6, 7, 9, 10, 12 and 13 combine to form an electrical schematic of the system of FIG. 3.
FIG. 8 is a view showing the arrangement of FIGS. 6 and 7 of the electrical schematic.
Figure 7:
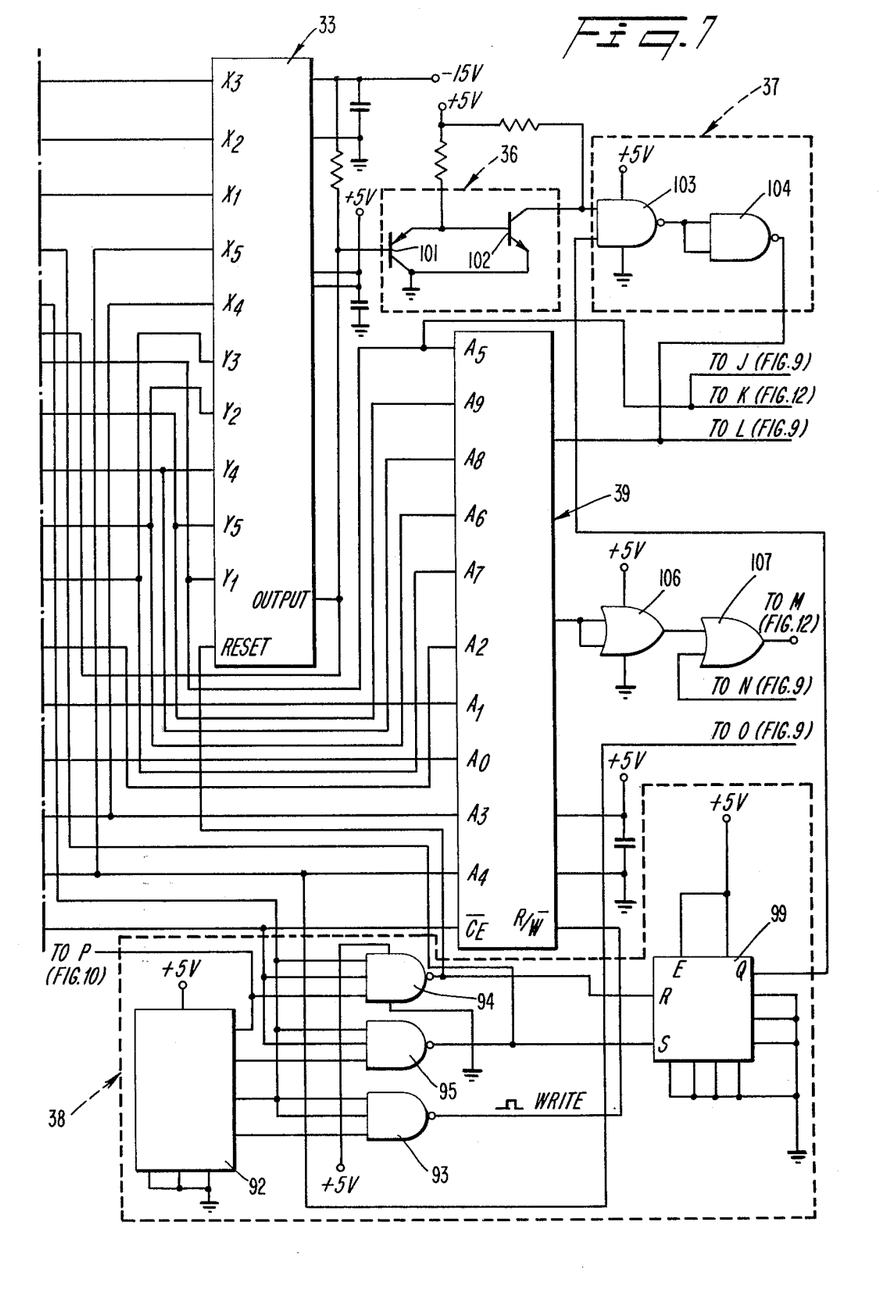

Referring to FIGS. 6 and 7, oscillator 31 is connected to the input of a 12-bit MC14040 binary counter which is used as the frequency divider 32. The basic frequency of the signal supplied by oscillator 31 is divided by multiples of two to provide twelve different frequencies designated as signals Q1 through Q12. Frequency signals Q1 through Q6 of divider 32 are coupled through a MC14049 buffer 88 while frequency signals Q7 through Q12 of the divider are coupled through a MC14049 buffer 389. Frequency signals Q2, Q3, and Q4 of divider 32 are further coupled through a MC14049 buffer 91 and are applied to X1, X2 and X3 inputs, respectively, of the image sensor 33. The image sensor 33 is identified as Model C-1024 and is commercially available from CROMECO of Los Altos, Calif. Frequency signals Q5 through Q11 of divider 32 are coupled through buffers 88 and 89, as described above, and applied to X4, X5, Y1, Y2, Y3, Y4 and Y5 inputs, respectively, of the image sensor 33.

Frequency signals Q2 through Q11 of divider 32 are also coupled through buffers 88 and 89, as described, to inputs A0 through A9, respectively of RAM 39. RAM 39 is available from Advanced Micro Devices of Sunnyvale, Calif. as model number 91L02. Frequency signal Q12 of divider 32 is coupled to clock input "C" of a MC14017 counter 92 and also to one input of each of three MC14023 NAND gates 93, 94 and 95. Frequency signals Q7, Q8 and Q9 from counter 92 are connected to inputs of NAND gates 93, 94 and 95, respectively. Frequency signal Q1 of divider 32 is coupled through buffer 88 to inputs of each of NAND gates 94 and 95 and also through diode 96 to the output of the image sensor 33. Frequency signal Q1 of divider 32 is also coupled through a MC14011 NAND gate 97 and a ULN2003 horizontal clock input buffer 98 of the display board 40. The output of NAND gate 93 is connected to a R/$\overline{W}$ (READ-NOT WRITE) input of RAM 39. The output of NAND gate 94 is connected to a "RESET" input "R" of a MC14044 flip-flop 99 and to a "RESET" input "R" of the image sensor 33. The output of NAND gate 95 is connected to a "SET" input "S" of flip-flop 99.

The output of sensor 33 is connected to the base of an NPN transistor 101, the collector of which is connected to a PNP transistor 102. Transistors 101 and 102 form the amplifier 36 and digitize the analog output of the sensor 33. The collector of transistor 102 is connected to one input of a MC14011 NAND gate 103. Output "Q" of flip-flop 99 is connected to the other input of NAND gate 103. The output of NAND gate 103 is connected to the inputs of a MC14011 NAND gate inverter 104. NAND gate 103 and inverter 104 form gate 37. NAND gate 103 digitizes the amplified analog output of sensor 33 after the amplified analog output has exceeded the threshold enabling level of the NAND gate as described hereinabove. The threshold level is typically set by the manufacture of NAND gate 103 as an enabling threshold to avoid enabling of the gate by low level noise. The output of inverter 104 is connected to the data input "D IN" of RAM 39. The output "D OUT" of RAM 39 is connected to a MC14071 OR gate 106 which is functioning as a buffer. The output of buffer 106 is connected to a MC14071 OR gate 107. The output of the OR gate 107 is connected to the data input "D" of a MC14015 dual shift register 108 (FIG. 12) located in the display board 40 to provide a path for data to the display board.

Figures 12, 14:
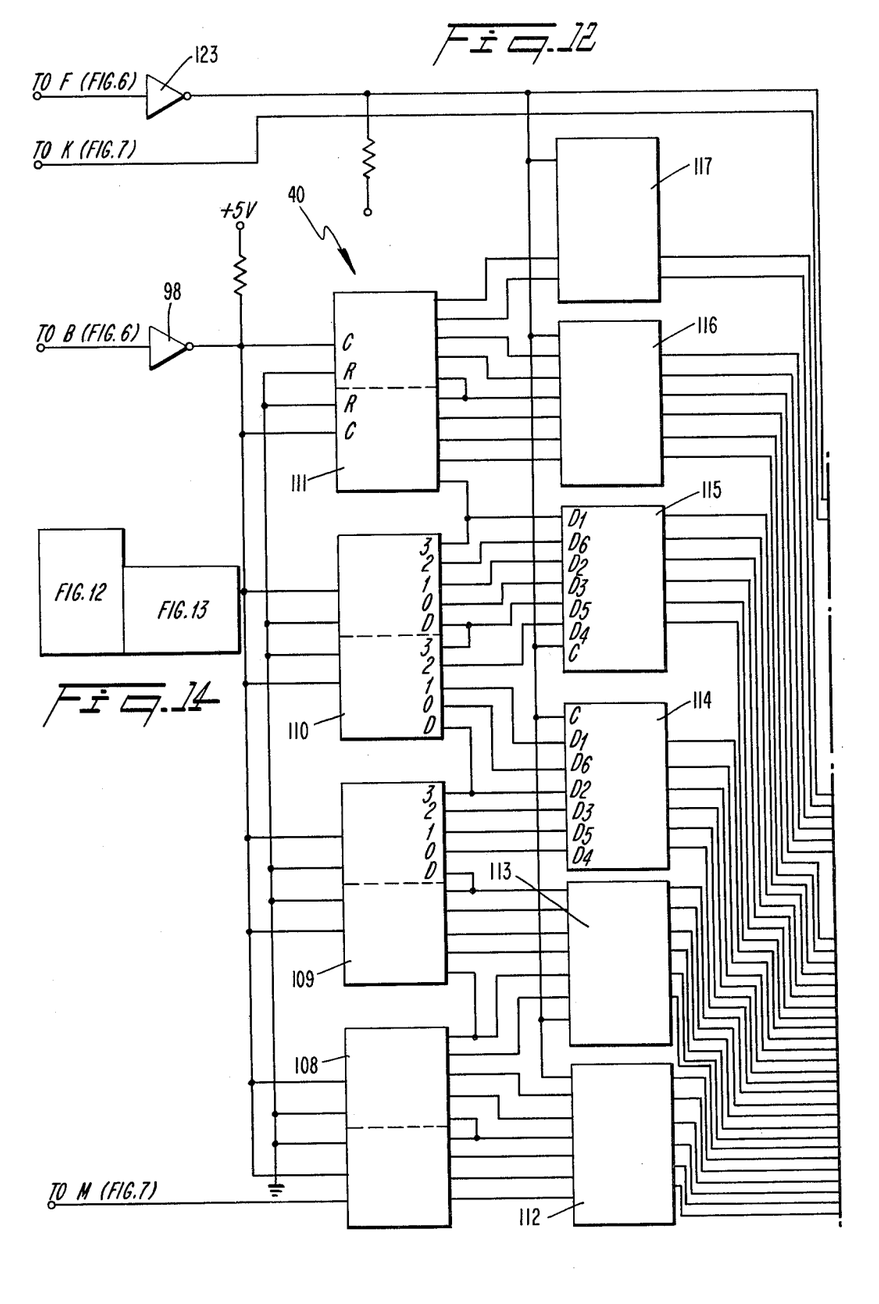
FIG. 14 is a view showing an arrangement of FIGS. 12 and 13 of the electrical schematic.
Figure 13:
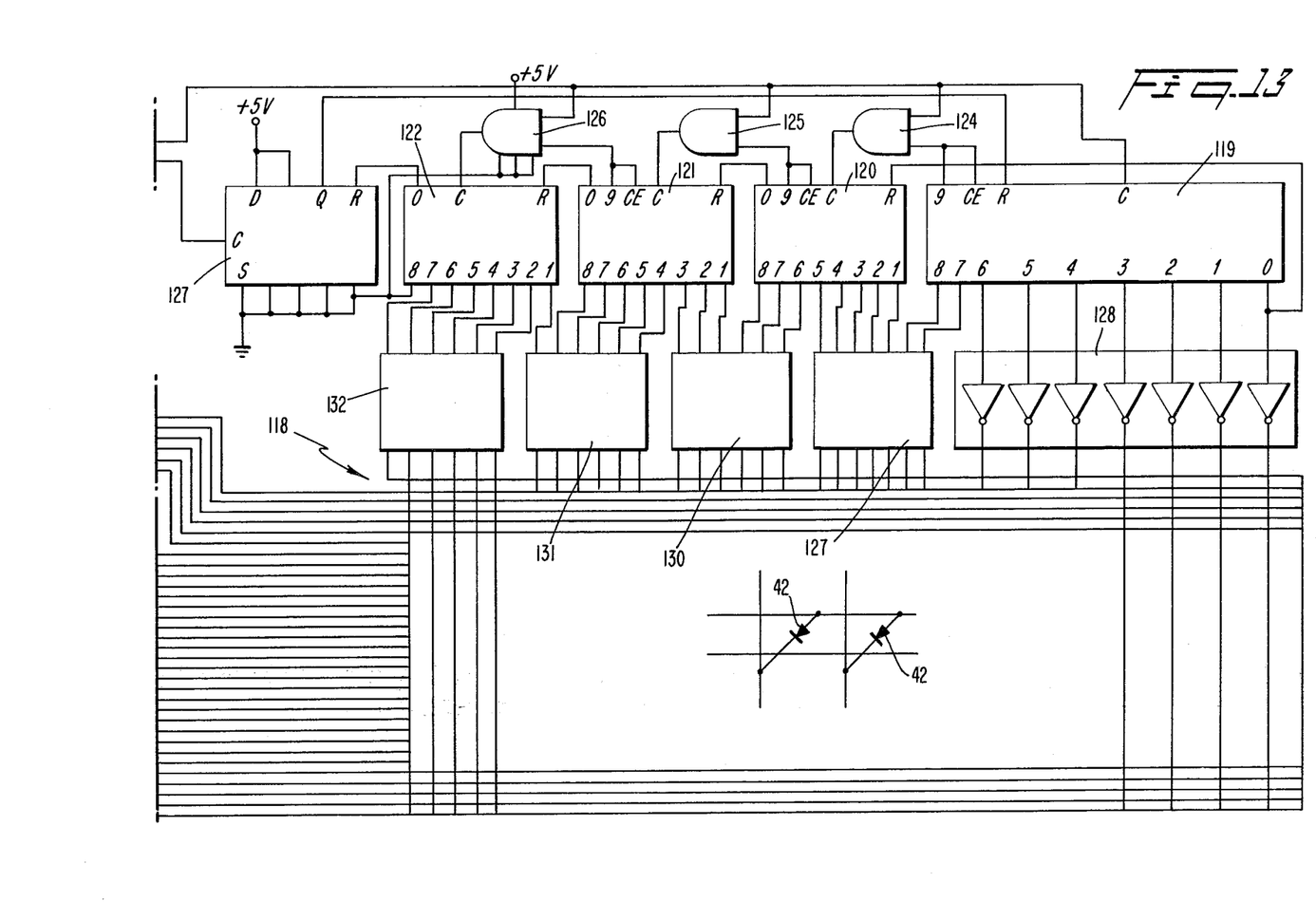

Referring to FIGS. 12 and 13, the display board 40 includes, in addition to shift register 108, a plurality of MC14015 dual shift registers 109, 110 and 111. Shift registers 108 through 111 are connected to provide sequential counting based on the frequency signal Q1 of the divider 32 which is fed through NAND gate 97 and buffer 98 to the clock inputs "C" of each shift register. The outputs of the shift registers 108 through 111 are coupled through 74174 buffers 112 through 117 to thirty-two horizontal lines of matrix array 118.

The display board 40 also includes four MC14017 shift registers 119, 120, 121 and 122. Frequency signals Q6 of divider 32 is coupled through a ULN2003 inverter 123 to the clock input "C" of shift register 119 and to one input of each of the three MC14081 AND gates 124, 125 and 126. The other inputs of each of the AND gates 124, 125 and 126 are connected to the penultimate count output "9" and clock-enable output "CE" of shift registers 119, 120 and 121, respectively. Frequency signal Q11 of divider 32 is coupled through buffer 89 to the clock input "C" of a MC14013 flip-flop 127. The data input "D" of flip-flop 127 is connected to a positive voltage and the "Q" output of the flip-flop is connected to a positive voltage and the "Q" output of the flip-flop is connected to reset input "R" of shift register 119. The last-count output "O" of shift register 122 is connected to the reset input "R" of flip-flop 127. The shift registers 119 through 122 are connected to provide sequential counting based on the frequency signal Q6 of the divider 32. The count output of the shift registers 119 through 122 is connected through five ULN2003 buffers 128 through 132 to thirty-two vertical lines of matrix array 118. Thus the horizontal and vertical lines of the matrix array 118 form a 32-by-32 array with 1024 crosspoints. One of the LED's 42 is connected at each crosspoint as illustrated with respect to two of the LED's in the center of the array.

Regarding operation of the display board 40, the frequency divider 32 divides the basic frequency of oscillator 31 into twelve frequency signals Q1 through Q12. The image sensor 33 is positioned over the datum mark 23 and is activated to condition the elements of the sensor to sense light appearing in direct line therewith.

Frequency signals Q2 through Q11 of divider 32 are fed to the sensor 33 to examine sequentially the 1024 elements of sensor for a light sensed condition. The combination of frequency signals fed to the sensor 33 establish the rate of element examination and provides for repetitive scanning of the elements.

The elements of the sensor 33 sense light in an accumulative sense. For example, if a given element is placed over a light reflective or light generating area, as increasing charge will develop in the element until the charge is released by resetting the sensor. Thus, each time the element is examined during scanning of the elements, the charge on the element may be greater than the charge during previous examinations. An output pulse is developed for each scan for each element which is sensing any level of light. However, for those elements sensing a low level of light, the initial output pulses will be low. Eventually, the charge on such elements will accumulate and provide higher level output pulses during later scans of the sixteen-scan period.

The output pulses of sensor 33 are negative and are coupled to the base of normally conducting transistor 101 which is operating as an emitter-follower. Low level output pulses of sensor 33 bias transistor 101 such that the transistor conducts less. This causes the base of transistor 102 to go more positive whereby the normally nonconducting transistor starts to conduct at a low level. As transistor 102 starts to conduct at a low level, the collector of the transistor becomes less positive which is coupled to the data input of NAND gate 103. However, as described hereinabove, NAND gate 103 has an enabling threshold which must be exceeded before the gate is enabled. Therefore, the output pulses of sensor 33 must be of sufficient level before NAND gate 103 can be enabled. For example, when the analog output pulses of sensor 33 are sufficiently negative to turn off normally conducting transistor 101, the base of transistor 102 goes positive whereby the transistor is turned on. At this point, the collector of transistor 102 goes to ground whereby one input of NAND gate 103 also goes to ground and the gate is enabled. The digital output of NAND gate 103 represents data from sensor 33.

Frequency signal Q12 of divider 32 is coupled through buffer 89 to the clock input "C" of counter 92 to provide frequency signals Q7, Q8 and Q9 at counter outputs. As noted above, the frequency signals Q2 through Q11 of divider 32 are fed to sensor 33 to provide for repetitive scanning of the elements. Without some means for resetting the sensor 33, the charge on each light sensing element would build unabated. The counter 92 is clocked to count twenty scans of the sensor 33 and then facilitate resetting of the sensor to begin a new twenty scan cycle. However, only data from the first sixteen scans are utilized. The time period for the remaining four scans is used to reset the various components within system 27 and perform other necessary functions.

Frequency signal Q9 of counter 92 occurs during the twentieth scan of the sensor 33 and is combined in gate 95 with frequency signals Q1 and Q12 to provide a pulse to the SET input "S" of flip-flop 99. This results in the "Q" output of flip-flop 99 going high. The high "Q" output of flip-flop 99 is coupled to the other input of NAND gate 103 which now permits the digital data pulses resulting from analog output pulses from the sensor 33 to be fed to the RAM 39 during the following scan cycles until the flip-flop is reset.

Since the input to the "R/$\overline{W}$" input of Ram 39 is negative, the RAM is in the READ mode and data being received at the "D IN" input of the RAM is not stored in the RAM. When the sixteenth scan is about to occur, frequency signal Q7 of counter 92 occurs and is fed to NAND gate 93 with frequency signal Q12 of divider 32. The output of gate 93 then goes high and is coupled to the "R/$\overline{W}$" input of RAM 39. This places the RAM 39 in the WRITE mode whereby data pulses from NAND gate 103 during the sixteenth scan are stored in the RAM. After the sixteenth scan has been completed, the output of NAND gate 93 goes low and RAM 39 returns to the READ mode.

At the beginning of the seventeenth scan, frequency signal Q8 of counter 92 occurs and is fed to NAND gate 94 along with frequency signals Q1 and Q12 of divider 32. At this time, the output of NAND gate 94 goes high and resets flip-flop 99 whereby the "Q" output goes low. The low "Q" output is coupled to NAND gate 103 which now prevents the passage of data signals from sensor 33. When NAND gate 94 goes high at the beginning of the seventeenth scan, sensor 33 is also reset whereby the charge on any element of the sensor is erased. During the period when the sensor 33 is being reset, spurrious signals may result which could provide erroneous data signals. Therefore, the low "Q" output of flip-flop 99 applied to NAND gate 103 prevents any of these erroneous signals from passing beyond the gate during the sensor reset period.

Eventually, frequency signal Q9 of counter 92 occurs during the twentieth scan of sensor 33 and flip-flop 99 is again set whereby the "Q" output goes high. This high "Q" output is coupled to NAND gate 103 to now permit passage of data pulses to RAM 39.

During the transition periods between the scanning of successive elements of the sensor 33, spurrious pulses could develop which could provide erroneous data signals. To preclude this possibility, frequency signal Q1 of divider 32 is coupled through diode 96 to the output of sensor 33 where the positive excursions of the frequency signal occurs during the transition periods. This insures that the potential appearing at the output of sensor 33 will always be positive during the transition periods even though spurrious pulses may develop within the sensor during these periods. Since the sensor output is positive, no pulses will appear at NAND gate 103.

Referring to FIGS. 12 and 13, frequency signal Q1 of divider 32 is fed to the shift registers 108 through 111 to sequentially pulse the thirty-two horizontal lines of the matrix array 118. Frequency signal Q6 of divider 32 is fed to shift registers 119 through 122 to sequentially pulse the thirty-two vertical lines of the matrix array 118.

Frequency signal Q11 of divider 32 is fed to the clock input "C" of flip-flop 127 where the data input "D" is permanently connected to a positive potential. The "Q" output of flip-flop 127 is connected to the reset input of shift register 119. Through flip-flop 127, the timing of frequency signal Q11 of divider 32 maintains shift register 119 in the reset mode even though frequency signal Q6 of divider 32 is being fed to the clock input "C" of the shift register. This condition is maintained until the scan of the top horizontal line in the matrix array 118 is to occur to insure that the display provided by the LED's 42 will start at the top of the array rather than at some other horizontal line. Gate 124 is enabled only after shift register 119 has been allowed to operate as noted above. Similarly, gates 125 and 126 are enabled only after shift registers 120 and 121 have operated. This process precludes premature clocking and operation of shift registers 120, 121 and 122 before the operation of shift register 119 and further insures the proper location of the LED display in the matrix array 118.

As noted above, during all but the sixteenth scan, RAM 39 is in the READ mode. Thus, the cells of RAM 39 are being scanned during each cycle and data is fed through buffer 106 and OR gate 107 to the data input "D" of shift register 108. This data is processed and, through operation of shift registers 108 through 111 and 119 through 122, cross points of selected horizontal and vertical lines of the matrix array 118 are supplied sufficient potential to operate the LED's 42 at the selected crosspoints. This results in a total display of LED's 42 to visually represent the alignment or misalignment of the datum mark 23 with the image sensor 33. This pattern is repeated upon each scan of the cells of RAM 39 and changes only after new data is fed into the RAM during the sixteenth scan of the sensor 33. Thus, the display by the LED's 42 provides an electronic reproduction of the location of the datum mark 23 relative to the image sensor 33.

A system similar to a portion of system 27, which portion includes the image sensor 33 and control circuits therefor, is disclosed in a published article entitled "Build CYCLOPS First All Solid-State TV Camera For Experimenters." This article appeared in *Popular Electronics*, Vol. 7, No. 2, February, 1975, at pages 27 through 31. The published article discloses an image sensor, an oscillator, a multiple frequency generating system using counters to establish vertical and horizontal scanning of the sensor and vertical and horizontal control for an oscilloscope. A digital data output from the sensor is also available for the oscilloscope.

Figure 9:
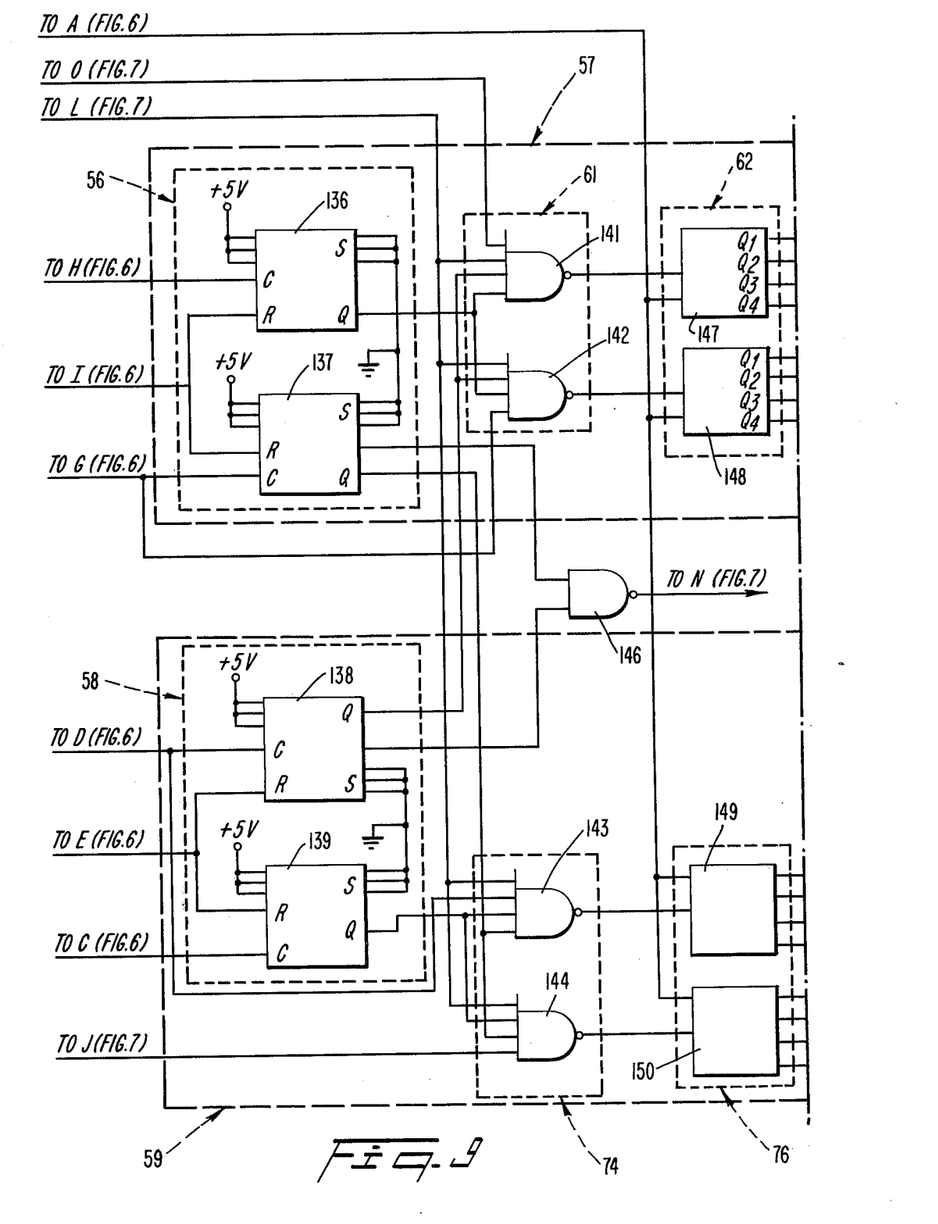
Figures 9, 10, 11:
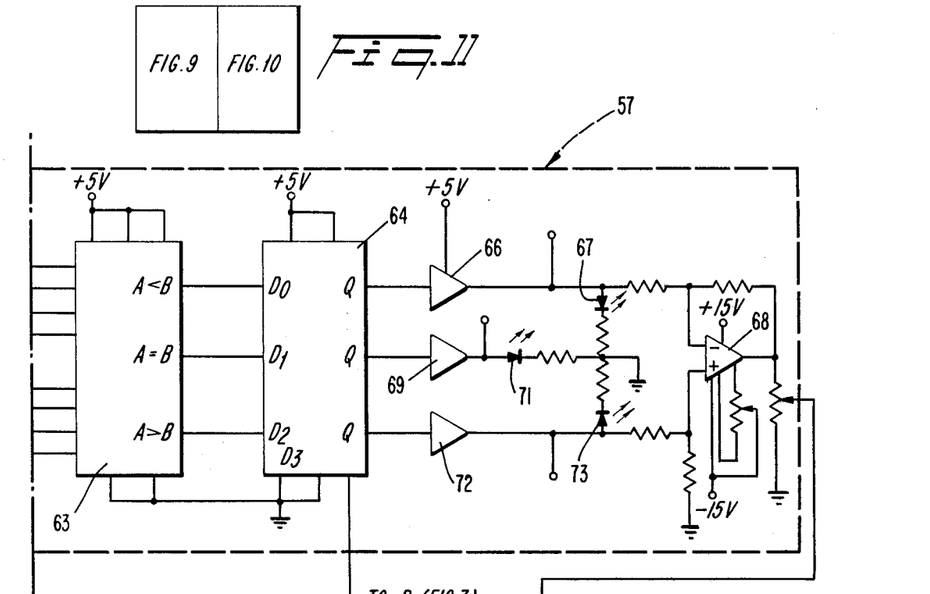
FIG. 11 is a view showing the arrangement of FIGS. 9 and 10 of the electrical schematic.
Figure 10:
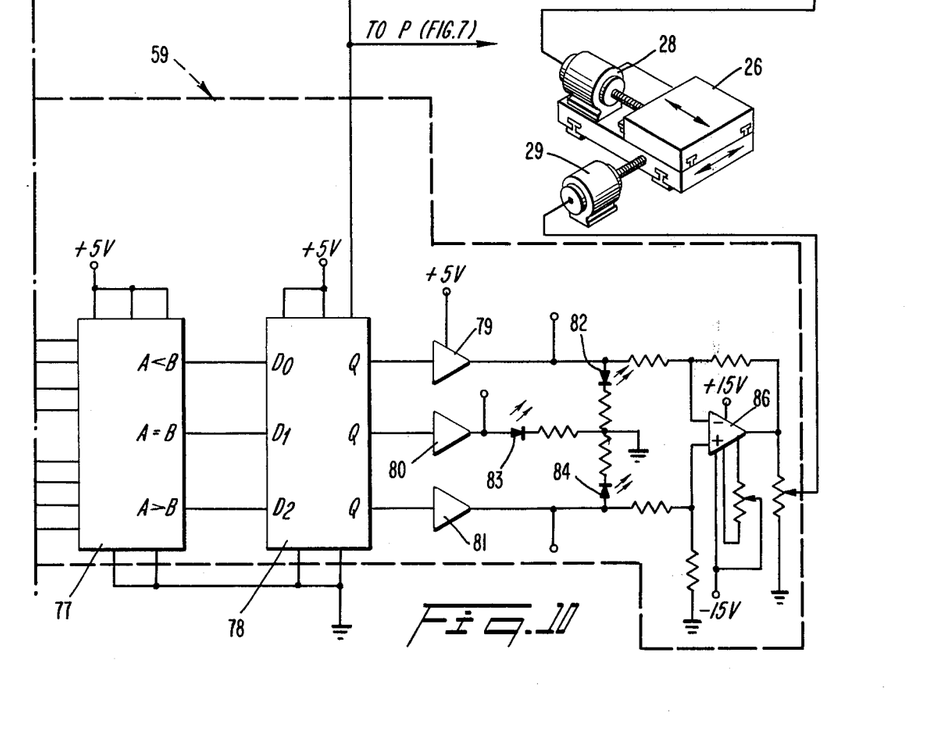

Referring to FIGS. 9 and 10, with reference to the control of motors 28 and 29 and to LED alignment indication, flip-flop 56 (FIG. 3) of horizontal channel 57 is formed by two MC14013 flip-flops 136 and 137. Flip-flop 58 (FIG. 3) of vertical channel 59 is formed by two MC14013 flip-flops 138 and 139. NAND gate 61 (FIG. 3) is formed by two MC14012 NAND gates 141 and 142 and NAND gate 74 (FIG. 3) is formed by two MC14012 NAND gates 143 and 144. Frequency signal Q5 of divider 32 is connected to the clock input "C" of flip-flop 136 and frequency signal Q1 of divider 32 is connected to the reset inputs "R" of flip-flops 136 and 137. Frequency signal Q6 of divider 32 is fed to the clock input "C" of flip-flop 137, one input of NAND gate 142 and, through buffer 88, to one input of NAND gate 141.

Frequency signal Q11 of divider 32 is fed to the clock input "C" of flip-flop 138, one input of NAND gate 143 and, through buffer 89, to one input of NAND gate 144. Frequency signal Q7 of divider 32 is fed to the reset inputs "R" of flip-flops 138 and 139. Frequency signal Q10 of divider 32 is fed to the clock input "C" of flip-flop 139. The light-sensed data output is fed from inverter 104 to one input of each of the NAND gates 141 through 144.

The "Q" output of flip-flop 136 is fed to one input of each of NAND gates 141 and 142 while the "Q" output of flip-flop 137 is fed to one input of each of NAND gates 143 and 144. The "Q" output of flip-flop 138 is fed to one input of each of NAND gates 141 and 142 and the "Q" output of flip-flop 139 is fed to one input of each of NAND gates 143 and 144. Outputs are also fed from NAND gates 137 and 138 to inputs of NAND gate 146.

Frequency signal Q9 of counter 92 is coupled through NAND gate 95 to the reset input "R" of each of four MC14520 counters 147, 148, 149 and 150. The inputs of NAND gates 141 through 144 are fed to the enable outputs "E" of counters 147 through 150, respectively. Counters 147 and 148 combine to form counter 62 (FIG. 3) and counters 149 and 150 combine to form counter 76 (FIG. 3).

The count outputs of counters 147 and 148 are fed to comparator 63 and the count outputs of counters 149 and 150 are fed to comparator 77. Comparators 63 and 77 are MC14585 type comparators. The outputs of comparators 63 and 77 are fed to latch circuits 64 and 78, respectively, which are MC14042 type circuits. The outputs of latch circuits 64 and 78 are then fed through circuits also illustrated in FIG. 3 to control servo motors 28 and 29. Frequency signal Q8 of counter 92 is fed to the reset input "R" of each of the latch circuits 64 and 78.

Regarding of the operation of system 27 to control motors 28 and 29, the following discussion will illustrate the selection of horizontal elements 52 and 54. Referring to FIG. 4, during a horizontal scan of thirty-two elements on horizontal line 16, the trailing edge of the first of two positive excursions of frequency signal Q5 of divider 32 sets flip-flop 136. The next trailing edge of one of thirty-two positive excursions of frequency signal Q2 of divider 32 resets flip-flop 136. This results in a first horizontal H-control pulse at the "Q" output of flip-flop 136 which is fed to one input of each of NAND gates 141 and 142. Also, the one positive excursion of frequency signal Q6 of divider 32 occurring during the scan of horizontal line 16 occurs during the development of the H-control pulse and is also fed to one input of NAND gate 142. Also, an inverted frequency signal Q6 of divider 32 is fed to NAND gate 141 during this period. Thus, the positive excursion of frequency signal Q6 is inverted and disables NAND gate 141 during this period.

Referring further to FIG. 4, frequency signals Q1 and Q7 of divider 32 combine to set and reset flip-flop 138 in a similar manner resulting in the development of a vertical V-crosshair pulse which occurs at vertical lines 8 and 24. This pulse is fed to an input of each of NAND gates 141 and 142. NAND gate 142 now has three enabling inputs awaiting the data pulse on the fourth input. However, NAND gate 141 has one disabling input from the inverted frequency signal Q6 of divider 32. During this period when NAND gate 142 has three enabling inputs, the data pulse representing the examined condition of horizontal cell 52 is fed to the NAND gate. At this time, NAND gate 142 is enabled and a pulse is fed to the enable input "E" of counter 148. During each of the sixteen scans of the image sensor 33, if light has been sensed and a sufficient charge has accumulated at element 52, a data pulse will be developed and a pulse fed from NAND gate 142 to counter 148.

During the negative excursion of frequency signal Q6 of divider 32, the combination of frequency signals Q5 and Q2 set and reset flip-flop 136 to again develop an H-control pulse which is again fed to NAND gates 141 and 142. However, the negative excursion of frequency signal Q6 is inverted and fed to NAND gate 141 to facilitate the enabling of the NAND gate. The negative excursion of frequency signal Q6 is fed to NAND gate 142 which disables the NAND gate. The vertical V- crosshair pulse (FIG. 4) is applied to both NAND gates 141 and 142 as described before. If element 54 has sensed sufficient light to provide a data pulse, the pulse is fed to NAND gates 141 and 142 where NAND gate 141 is enabled. A data pulse is then fed from NAND gate 141 to counter 147 where an accumulating count is made during the sixteen scans for element 54.

The count data from counters 147 and 148 is fed to comparator 63. The comparator 63 provides one of three outputs representing that the light sensed by element 52 is either less than (A<B), equal to (A=B) or greater than (A>B) the light sensed by element 54. If the sensed light of element 52 is less than that of element 54, a signal is fed through latch circuit 64 and amplifier 66 to LED 67 to indicate this condition. The signal is also fed to operational amplifier 68 to facilitate control of horizontal servo motor 28 to move housing 26. This results in the movement of the sensor 33 relative to the datum mark 23 to align the sensor with the mark.

If the amount of light sensed by element 52 equals that sensed by element 54, a signal is fed from the comparator 63 through latch circuit 64 and amplifier 69 to LED 71 to indicate this condition. If the amount of light sensed by element 52 is treater than that of element 54, a signal is fed from comparator 63 through latch circuit 64 and amplifier 72 to LED 73 to indicate this condition. The signal is also fed to operational amplifier 68 to facilitate control of horizontal servo motor 28 to move housing 26 in an aligning corrective direction resulting in the alignment of the sensor 33 with the datum mark 23.

Frequency signal Q8 of counter 92 is fed to the reset input "R" of latch circuit 64 and latches the output of the circuit on pulses received from comparator 63 resulting from the sixteenth scan. Subsequent pulses from the comparator 63 to latch circuit 64 do not have any effect upon the circuit until the next frequency signal Q8 is received from counter 92. This effectively isolates the LED's 67, 71 and 73 and motor 28 from the comparator 63 and precludes premature LED visual display and operation of the motor.

Additional output pulses from flip-flops 137 and 138 are fed to NAND gate 146. The output of NAND gate 146 is fed through OR gate 107 to the data input "D" of shift register 108. These pulses facilitate permanent activation of LED's 42 which form horizontal and vertical crosshairs corresponding to crosshairs 43 and 44 (FIG. 4).

The combination of frequency signal inputs to flip-flops 138 and 139 and NAND gates 143 and 144 provide control for vertical channel 59 in the same manner as just described above for horizontal channel 57. LED's 82, 83 or 84 would be activated for visual indication and servo motor 29 would be operated when needed.

System 27 provides a dynamic technique for sensing a light reflecting pattern with exceptional accuracy. As noted above, each of the elements of sensor 33 will build or accumulate a charge on a continuing basis as long as a light reflective or light generating area is aligned with the element. For those light areas which border on darkness, the elements may not develop sufficient charge initially to indicate the presence of such light. By processing system 27 through sixteen scans of sensor 33, sufficient time is allowed for light-indicating charges to develop on the elements. System 27 could be designed to scan sensor 33 more than sixteen times, without departing from the spirit and scope of the invention, and thereby provide further refinement in the light sensing operation.

The physical perimeter dimensions of the portion of sensor 33 which contains the elements is 0.100 inch by 0.100 inch. Thus the 1024 elements are each approximately 0.003 inch in dimension. Therefore, the target, such as datum mark 23, is divided into 1024 minute segments to be examined by sensor 33. This permits fine line integrity of examination of the line where light and darkness meet on the datum mark 23. Such integrity is not available with conventional static photocell systems.

Figure 15:
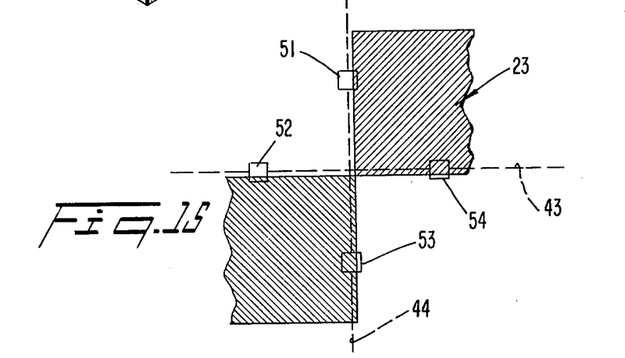
FIG. 15 is a view showing an overlay of the reference target and the four elements.

By coupling the multiple scanning technique with the fine line integrity capability of sensor 33, an extremely accurate representation of datum mark 23 can be obtained. For example, as illustrated in FIG. 15, the datum mark 23 is extremely close to being aligned with elements 51 through 54 of sensor 33. Each of the elements 51 through 54 is sensing some amount of light but less than total light exposure. The minute size of each element 51 through 54 permits a fine line sensitivity along the lines where light and darkness areas of the datum mark 23 meet. By multiple scanning of the four elements 51 through 54, thereby permitting an accumulative charge to build in each element, sufficient light-enhanced data is derived to determine the precise degree of misalignment and to initiate corrective measures. For instance, when using sixteen scans for each measurement, each 0.003 inch element can distinguish sixteen levels of light which yields an ultimate accuracy, without optical magnification, of approximately 0.0002 inch.

As described above, the data output of only four elements 51 through 54 is examined to obtain the necessary data to provide alignment indication and, if necessary, to control the operation of servo motors 28 and 29. This permits the use of a highly sensitive device such as sensor 33, with all the attributes described above, while making the most efficient use of the derived data. Further, by using the combination of counters 147 and 148 with comparator 63, and counters 149 and 150 with comparator 77, the data derived from the sixteen scans of the sensor 33 permits an accumulation of data to be used in the determination of whether motors 28 and 29 need be operated and the direction and distance of such movement. Again, by being able to analyze dynamically an accumulative amount of data as compared to a single piece of data, the results are greatly enhanced and provide a highly accurate observation of the alignment or misalignment.

Figure 16:
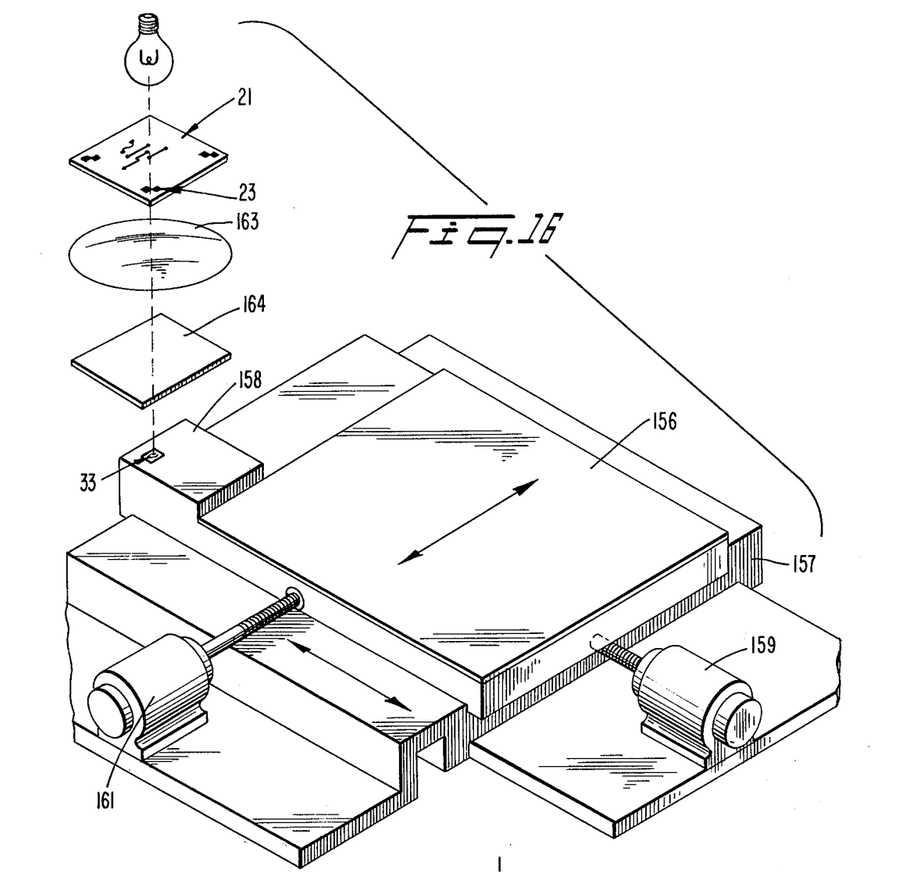
FIG. 16 is a perspective view showing an arrangement for making printed circuit artwork using the system of FIG. 3.

Referring to FIG. 16, artwork is developed by using artmaster 21. An undeveloped sheet 156 of photographic film is placed on a movable table 157. A housing 158 containing system 27 is also placed on the table 157 with the 1024 elements of the sensor 33 facing upwardly from the housing and with the sensor located precisely with respect to the sheet 156. A "X" servo motor 159 and a "Y" servo motor 161 are provided for moving the table 157 in the "X" and "Y" directions. Artmaster 21 is inserted into an optical exposure system including a light source 162, lens 163 and shutter 164.

Initially, table 157 is positioned so that the housing 158 is located beneath the shutter 164. The shutter 164 is then withdrawn to expose the light-backed artmaster 21 to the elements of sensor 33. In the position, the datum mark 23 is generally aligned with sensor 33. System 27 then responds to the sensed misalignment between the datum mark 23 and sensor 33 and facilitates control of motors 159 and 161 to move table 157. This process continues until the datum mark 23 and sensor 33 are aligned. Shutter 164 is then closed and table 157 can be indexed precise distances and directions to position the sheet 156 for a selected number of exposures to the pattern 22 of artmaster 21. The sheet 156 is thereafter processed in a conventional manner to provide artwork having the pattern 22 appearing at one or more selected locations thereon.

What is claimed is:

1. A method of determining the alignment position of a reference target having light reflective and dark areas with respect to a device, which comprises the steps of:
   locating at least two spaced light-sensing charge-accumulating elements of the device in general alignment with the target so that an accumulating charge will develop within those elements which are sensing light;
   scanning each element a plurality of times to determine the accumulated charge on the element during each scan;
   developing a data pulse during each scan for each element when the accumulated charge exceeds a predetermined level;
   counting the number of data pulses emanating from each element;
   comparing the counts of data pulses from the two elements;
   and
   developing a signal in response to the comparison of counted data pulses as a representation of the comparative light sensed by the two elements and the alignment position of the target with respect to the device.

2. A method of aligning a device with a reference target having light reflective and dark areas, which comprises the steps of:
   locating at least two spaced light-sensing charge-accumulating elements of the device in general alignment with the target so that an accumulating charge will develop within those elements which are sensing light;
   scanning each element a plurality of times to determine the accumulated charge on the element during each scan;
   developing a data pulse during each scan for each element when the accumulated charge exceeds a predetermined level;
   counting the number of data pulses emanating from each element;
   comparing the counts of data pulses from the elements;
   developing a signal in response to the comparison of counted data pulses as a representation of the comparative light sensed by the elements; and
   relocating the elements of the device and the target in response to the developed signal to bring the elements and the target into precise alignment.

3. The method of aligning as set forth in claim 2, which further comprises the step of indicating visually, and in response to the developed signal, the alignment relationship between the elements of the device and the reference target.

4. The method of aligning as set forth in claim 2, wherein the device includes a plurality of light-sensing charge-accumulating elements sufficient in number to overlay the reference target, and which further comprises the step of producing a visual display of the position of the reference target with respect to the device based on data pulses from the plurality of elements.

5. The method of aligning as set forth in claim 4, which further comprises the step of reproducing electronically the visual display based on data pulses derived only during a selected single scan.

6. The method of aligning as set forth in claim 2, wherein the step of developing a data pulse includes the steps of:
   developing an element output pulse for each element each time the element is scanned where the level of the output pulse is determined by the accumulated charge on the element at the time of the scan; and
   feeding the developed output pulse to a threshold gate which develops a data pulse for each output pulse which exceeds a predetermined level established by the gate.

7. The method of aligning as set forth in claim 2, wherein the device includes a plurality of light-sensing charge accumulating elements sufficient in number to overlay the reference target, and which further comprises the step of selecting data pulses from only the two spaced elements for processing in the step of counting.

8. The method of aligning as set forth in claim 7, which further comprises the step of producing a visual display of the position of the reference target with respect to the device based on data pulses from the plurality of elements.

9. The method of aligning as set forth in claim 2, wherein the reference target has distinctive light and darkened areas which meet along horizontal and vertical coordinates and wherein the device has similarly arranged horizontal and vertical coordinates, and which further comprises the steps of:
   locating the two spaced elements along the horizontal coordinate of the device on opposite sides of the vertical coordinate of the device; and
   locating at least two additional light-sensing charge-accumulating elements along the vertical coordinate of the device on opposite sides of the horizontal coordinate of the device whereby the two horizontal-coordinate elements and the two vertical-coordinate elements provide for two dimensional alignment of the reference target and the device.

10. A system for aligning a device with a reference target having light reflective and dark areas, which comprises:
   at least two spaced light-sensing charge-accumulating elements located within the device;
   means for locating the device in general alignment with the target so that an accumulating charge will develop within those elements which are sensing light;
   means for scanning each element a plurality of times to determine the accumulated charge on the element during each scan;
   means for developing a data pulse during each scan for each element when the accumulated charge exceeds a predetermined level;
   means for counting the number of data pulses emanating from each element;
   means for comparing the counts of data pulses from the two elements;
   means for developing a signal in response to the comparison of counted data pulses as a representation of the comparative light sensed by the two elements; and means for relocating the elements of the device and the target in response to the developed signal to bring the elements and the target into precise alignment.

11. The system for aligning as set forth in claim 10, which further comprises means for indicating visually, and in response to the developed signal, the alignment relationship between the elements of the device and the reference target.

12. The system for aligning as set forth in claim 10, wherein the device comprises a plurality of light-sensing charge-accumulating elements sufficient in number to overlay the reference target, and wherein the system further comprises means for producing a visual display of the position of the reference target with respect to the device based on data pulses from the plurality of elements.

13. The system for aligning as set forth in claim 12, which further comprises means for reproducing electronically the visual display based on data pulses derived only during a selected single scan.

14. The system for aligning as set forth in claim 10, wherein the means for developing a data pulse comprises:

means for developing an element output pulse for each element each time the element is scanned where the level of the output pulse is determined by the accumulated charge on the element at the time of the scan;

a threshold gate which is enabled after an input pulse to the gate exceeds a predetermined level; and means for feeding the developed output pulse to the threshold gate which develops a data pulse for each output pulse which exceeds the predetermined level established by the gate.

15. The system for aligning as set forth in claim 10, wherein the device comprises a plurality of light-sensing charge accumulating elements sufficient in number to overlay the reference target, and wherein the system further comprises means for selecting data pulses from only the two spaced elements for processing by the counting means.

16. The system for aligning as set forth in claim 15, which further comprises means for producing a visual display of the position of the reference target with respect to the device based on data pulses from the plurality of elements.

17. The system for aligning as set forth in claim 10, wherein the reference target has distinctive light and darkened areas which meet along horizontal and vertical coordinates and wherein the device has similarly arranged horizontal and vertical coordinates, wherein the device comprises:

the two spaced elements being positioned along the horizontal coordinate of the device on opposite sides of the vertical coordinate of the device; and at least two additional light-sensing charge-accumulating elements being positioned along the vertical coordinate of the device on opposite sides of the horizontal coordinate of the device whereby the two horizontal-coordinate elements and the two vertical-coordinate elements provide for two dimensional alignment of the reference target and the device.

18. The system as set forth in claim 10, which further comprises means for limiting the number of times the elements are scanned and the period during which the elements accumulate a charge.

19. The system as set forth in claim 10, which further comprises means for controlling the signal developing means to be responsive only to the final comparison of counted data pulses in developing the signal representative of the comparative light sensed by the two elements.

* * * * *